US008532972B2

(12) United States Patent
Sekino et al.

(10) Patent No.: US 8,532,972 B2
(45) Date of Patent: Sep. 10, 2013

(54) METHOD AND A NON-TRANSITORY COMPUTER-READABLE RECORDING MEDIUM FOR SIMULATING A MANUFACTURING PROCESS OF A STRUCTURE

(75) Inventors: Yuki Sekino, Yokohama (JP); Sanae Ito, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 201 days.

(21) Appl. No.: 13/038,562

(22) Filed: Mar. 2, 2011

(65) Prior Publication Data
US 2011/0230992 A1 Sep. 22, 2011

(30) Foreign Application Priority Data

Mar. 16, 2010 (JP) ................................ 2010-058986

(51) Int. Cl.
*G06F 17/50* (2006.01)
*G06F 9/455* (2006.01)
*G06F 19/00* (2011.01)

(52) U.S. Cl.
USPC .................. 703/14; 703/13; 700/97; 716/116

(58) Field of Classification Search
USPC ................ 700/97; 703/13–14; 716/100, 106
See application file for complete search history.

(56) References Cited

U.S. PATENT DOCUMENTS

| 5,699,271 | A  | * | 12/1997 | Sagawa et al. ............... 716/106 |
|---|---|---|---|---|
| 6,192,330 | B1 | * | 2/2001 | Nakamura ...................... 703/13 |
| 6,505,147 | B1 | * | 1/2003 | Kumashiro ...................... 703/2 |
| 7,162,400 | B2 | * | 1/2007 | Ito et al. ........................ 703/13 |
| 7,424,411 | B2 | * | 9/2008 | Ito ..................................... 703/2 |
| 2002/0087298 | A1 | * | 7/2002 | Ito et al. ........................ 703/14 |
| 2004/0092061 | A1 | * | 5/2004 | Kawasaki et al. ............ 438/166 |
| 2005/0171745 | A1 | * | 8/2005 | Breitfeld et al. ................. 703/2 |
| 2005/0203721 | A1 | * | 9/2005 | Ito ..................................... 703/2 |
| 2010/0156936 | A1 | * | 6/2010 | Maeda et al. ................. 345/647 |
| 2011/0008931 | A1 | * | 1/2011 | Yamazaki et al. ............ 438/104 |
| 2012/0179426 | A1 | * | 7/2012 | Fontes et al. ..................... 703/1 |

FOREIGN PATENT DOCUMENTS

| JP | 05-121740 | 5/1993 |
|---|---|---|
| JP | 06-097020 | 4/1994 |
| JP | 10-125612 | 5/1998 |
| JP | 10-303192 | 11/1998 |

OTHER PUBLICATIONS

Japanese Office Action for Japanese Application No. 2010-058986 mailed on Jul. 31, 2012.

* cited by examiner

*Primary Examiner* — Ramesh Patel
(74) *Attorney, Agent, or Firm* — White & Case LLP

(57) ABSTRACT

According to one embodiment, a method of simulating a manufacturing process of a structure including adjacent components, the method includes causing a computer to perform operations of: importing mesh and material data set for each component; specifying, as a calculation target, a region in a first component in which impurities are to be diffused among the components; setting a virtual film of a desired thickness in contact with the region whose material is the same as that of a second component in contact with the specified calculation target; setting boundary conditions at interface between the region and the virtual film, based on the material data; incorporating the boundary conditions into diffusion equations to solve the diffusion equations of the region and the virtual film; and bringing data on the concentration of impurities of the region obtained by the calculation into data on the structure before the specification of the region.

14 Claims, 10 Drawing Sheets

(Lg=45nm)

METHOD AND A NON-TRANSITORY COMPUTER-READABLE RECORDING MEDIUM FOR SIMULATING A MANUFACTURING PROCESS OF A STRUCTURE

CROSS REFERENCE TO RELATED APPLICATIONS

This application is based upon and claims the benefit of priority from the prior Japanese Patent Application No. 2010-058986, filed on Mar. 16, 2010, the entire contents of which are incorporated herein by reference.

FIELD

Embodiments described herein relates generally to a process simulation method, semiconductor device designing method and non-transitory computer-readable recording medium.

BACKGROUND

As a simulation technique for a semiconductor device having a large-scale structure there is a technique referred to as a TCAD (technology CAD (computer aided design)) technique. The TCAD technique mainly comprises a process simulation technique for simulating how a semiconductor device is processed in a manufacturing process, and a device simulation technique for simulating operating characteristics of the semiconductor device.

However, the problem is that a great amount of time is required for the calculation of impurity diffusion in a process simulation, and that the simulation accuracy for the calculation of impurity diffusion is decreased if the calculation time is reduced.

DETAILED DESCRIPTION

In general, according to one embodiment, a method of simulating a manufacturing process of a structure including adjacent components, the method including causing a computer to perform operations of: importing mesh data and material data which are set for each of components; specifying, as a calculation target region, a region in a first component in which impurities are to be diffused among the components; setting a virtual film of a desired thickness in contact with the region, the material of the virtual film being the same as the material of a second component in contact with the specified calculation target region; setting boundary conditions at the interface of the region and the virtual film for impurities, on the basis of the material data; incorporating the boundary conditions into diffusion equations to solve the diffusion equations of the region and the virtual film; and bringing data on the concentration of impurities in the region obtained by the calculation into data on the structure before the specification of the region. Embodiments will now be explained with reference to the accompanying drawings. Throughout the drawings, like numbers are assigned to like parts, and repeated explanations are given when necessary.

Figure 1:
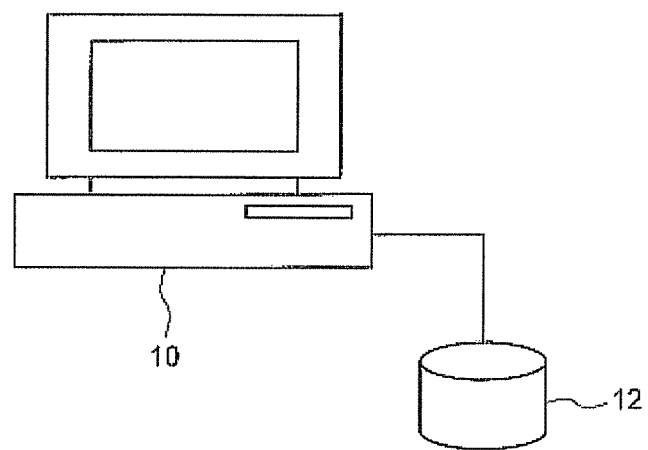
FIG. 1 is a block diagram showing an example of a conventional computer for executing a process simulation according to an embodiment.

FIG. 1 shows a computer 10 for executing a process simulation according to the embodiment. An external hard disk drive 12 is connected to the computer 10. In this external hard disk drive 12 a recipe file in which procedures of the process simulation explained below in detail are recorded is stored. The computer 10 reads the recipe file from the hard disk drive 12, and executes the process simulation. It is to be noted that a recording medium is not exclusively a fixed recording medium such as the hard disk drive 12 or a memory, and may be a portable recording medium such as a magnetic disk or an optical disk.

Figure 2:
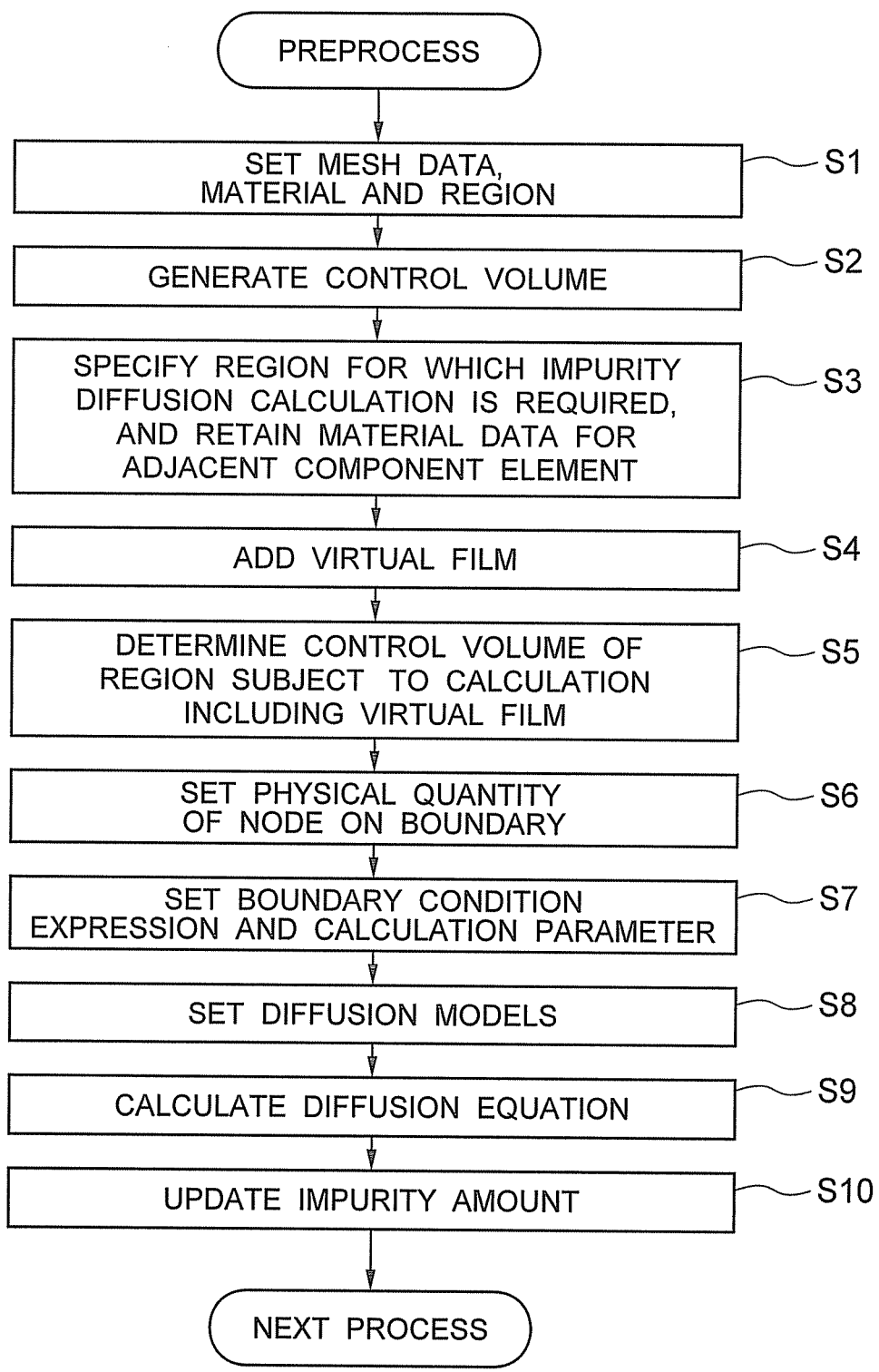
FIG. 2 is a flowchart showing a schematic procedure of the process simulation according to the embodiment.

FIG. 2 is a flowchart showing a schematic procedure of the process simulation according to the embodiment.

First, mesh data, a material and a region number are set for each of the components of a structure targeted for the simulation (step S1). The components include, for example, a silicon substrate, a gate oxide film, a gate and an element isolation insulating film. A database in which mesh data, a material and a region number are set for each of the components in advance may be used.

Furthermore, a control volume is generated for each of the components from the information including the mesh data, the material and the region number (step S2).

Furthermore, a region for which an impurity diffusion calculation is required is specified in the structure targeted for the simulation (step S3). There are two methods of specifying a region subject to the impurity diffusion calculation:

According to the first method, a calculation target region is considered as a segment, a rectangle or a rectangular parallelepiped for each of one-dimensional to three-dimensional simulations, and two points which are both ends of the segment or both ends of a diagonal of the rectangle or rectangular parallelepiped are designated. According to the second method, a material is only designated. In the embodiment, a region is specified by the second method. The reason is that data on the material is already provided for each of the components of the simulation target structure by step S1 and this is used to significantly reduce an input burden for a TCAD user.

In specifying a region where an impurity diffusion calculation is made, there is retained material data of a component (this is hereinafter referred to as the adjacent component) which has been in contact with a specified region (this is hereinafter referred to as the specified region) before the specification of the region, among the components other than the component in the specified region (step S3).

Furthermore, a virtual film corresponding to the adjacent component is added to an interface of the specified region (step S4). The same material as the material of the adjacent component is selected for the virtual film. That is, the material of the virtual film is not invariable, and varies depending on the adjacent component of each specified region. The thickness of the virtual film can be designated by the user in accordance with input data.

The reason for adding the virtual film in contact with the specified region is as follows:

When an impurity diffusion calculation is performed exclusively for a specific region such as the specified region, it is not possible to consider the boundary condition between the specified region and a component which has been adjacent in the structure before the specification of the region (this structure is hereinafter referred to as an original structure) but which is no longer adjacent, that is, no longer targeted for a calculation as a result of the specification of the region. Consequently, it is not possible to consider, for example, the influence of segregation or dose loss at an interface between silicon and a silicon oxide film. Thus, the simulation accuracy for the calculation of impurity diffusion in the specified region is reduced.

Therefore, according to the embodiment, a virtual film in contact with the interface of the specified region is set to correspond to the adjacent component excluded from the calculation region by region restriction, and impurity diffusion is calculated accordingly, so that a highly accurate calculation result can be obtained.

A procedure of adding a virtual film is more specifically described with reference to FIGS. 3A to 3C. A silicon (Si) layer 2 is formed in a lower layer of a structure 10 shown in FIG. 3A. A silicon oxide film ($SiO_2$) 4 and a silicon nitride film ($Si_3N_4$) 6 are formed in contact with the upper surface of the silicon layer 2. In the embodiment, the silicon layer 2 corresponds to, for example, a first component in which impurities are diffused, and the silicon oxide film 4 and the silicon nitride film 6 which are adjacent components correspond to, for example, second components adjacent to the first component.

Here, when the user desires an impurity diffusion calculation for a region of the silicon layer 2 alone, the region of the silicon layer 2 is the specified region, and the materials of the components above the silicon layer 2 are not targeted for the calculation. However, as schematically shown in FIG. 3B, data NMD4 on the material (silicon dioxide ($SiO_2$)) of the silicon oxide film 4 with which the silicon layer 2 has been in contact and data NMD6 on the material (silicon nitride ($Si_3N_4$)) of the silicon nitride film 6 with which the silicon layer 2 has been in contact are retained in an unshown memory (FIG. 2, step S3).

Figure 3A:
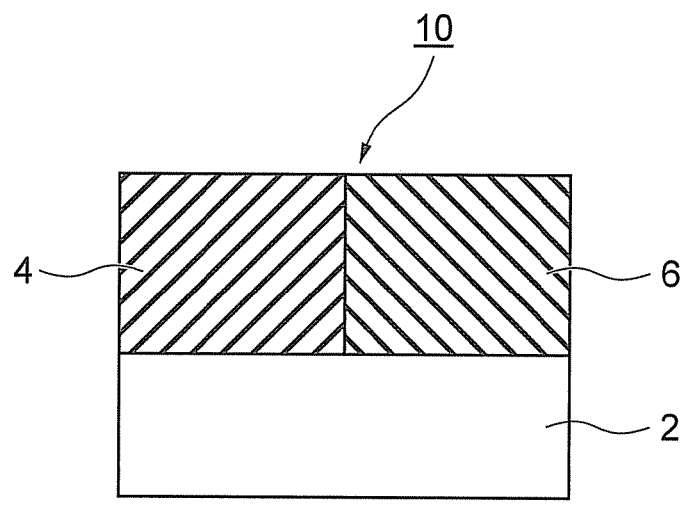
FIGS. 3A to 3C are explanatory diagrams for a procedure of adding a virtual film.
Figure 3B:
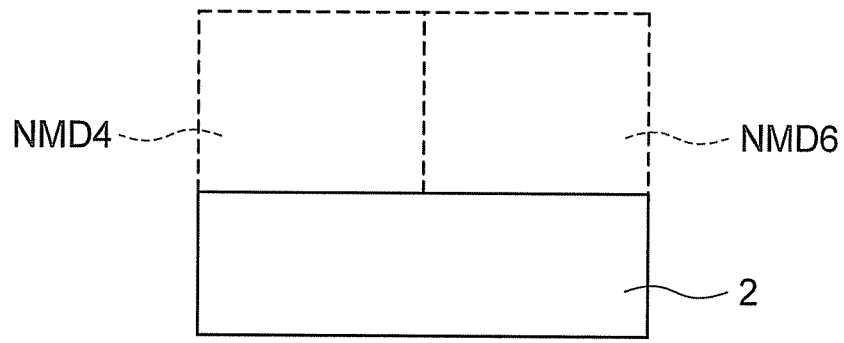
Figure 3C:
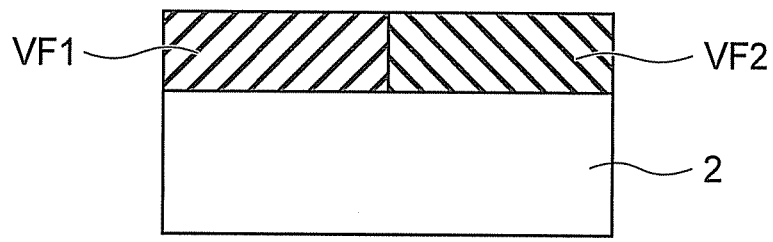

Furthermore, as shown in FIG. 3C, virtual films VF1 and VF2 having the same materials as the silicon oxide film ($SiO_2$) 4 and the silicon nitride film ($Si_3N_4$) 6 are added to the silicon layer 2 (step S4).

As a result of such addition of the virtual films VF1 and VF2, each boundary conditions between the component excluded by the region restriction based on the material designation and the specified region (between the silicon oxide film 4 and the silicon layer 2 and between the silicon nitride film 6 and the silicon layer 2 in the example shown in FIG. 3A) can be incorporated into diffusion equations to perform a calculation. A function of adding the virtual films VF1 and VF2 can be obtained by applying part of a deposition calculating module implemented in a known simulator to the embodiment. Moreover, control volumes can be newly set as the virtual films VF1 and VF2.

Back to FIG. 2, according to the embodiment, control volumes in the calculation region including the virtual films VF1 and VF2 are determined (FIG. 2, step S5). Further, a lattice point on the boundary between the specified region and the virtual film is determined as a multiple node, so that, for example, physical quantities on each component are set in the multiple node (step S6).

Furthermore, boundary conditions are set on the basis of the materials of the virtual films VF1 and VF2, and a parameter such as a convergence condition for an impurity diffusion calculation is set (step S7).

After diffusion models are then set (step S8), diffusion equations corresponding to all of the set diffusion models are solved (step S9).

Figure 4A:
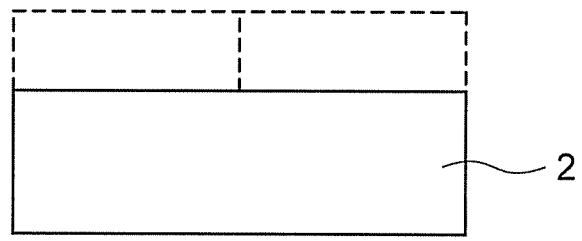
FIGS. 4A and 4B are explanatory diagrams showing how to dispose of information on the added virtual film to reflect a calculation result in information on a structure before specification of a calculation target region.
Figure 4B:
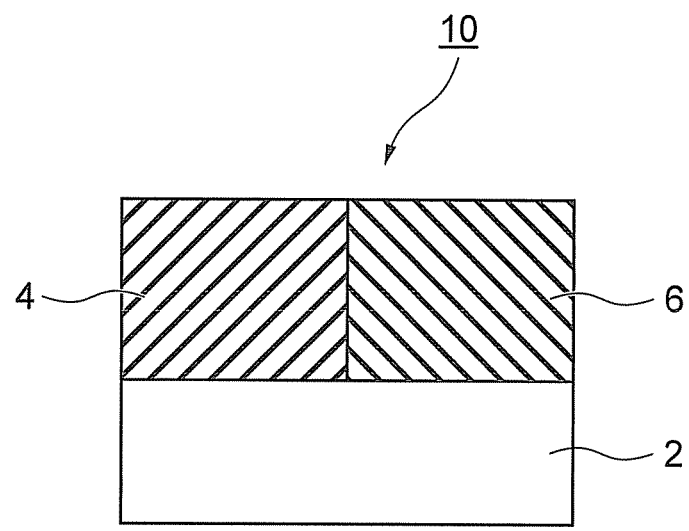

Data on the concentration of impurities of the original structure 10 is updated in accordance with the calculation result of the diffusion equations (step S10), and as schematically shown in FIGS. 4A and 4B, the data on the impurity concentrations of the virtual films VF1 and VF2 is then disposed of or reflected to proceed to the next process. When the concentration data of impurities for the virtual films VF1 and VF2 is disposed of, the concentration data of impurities is not reflected in the data for the original structure 10.

The effects of the process simulation according to the embodiment are described by comparison with two comparative examples.

Comparative Example 1

Comparative Example 1 concerns a method of specifying a region in accordance with the first method described above and calculating impurity diffusion. According to Comparative Example 1, the TCAD user inputs coordinate points to specify a region to which an impurity diffusion calculation is to be restricted in a target structure.

Figure 5:
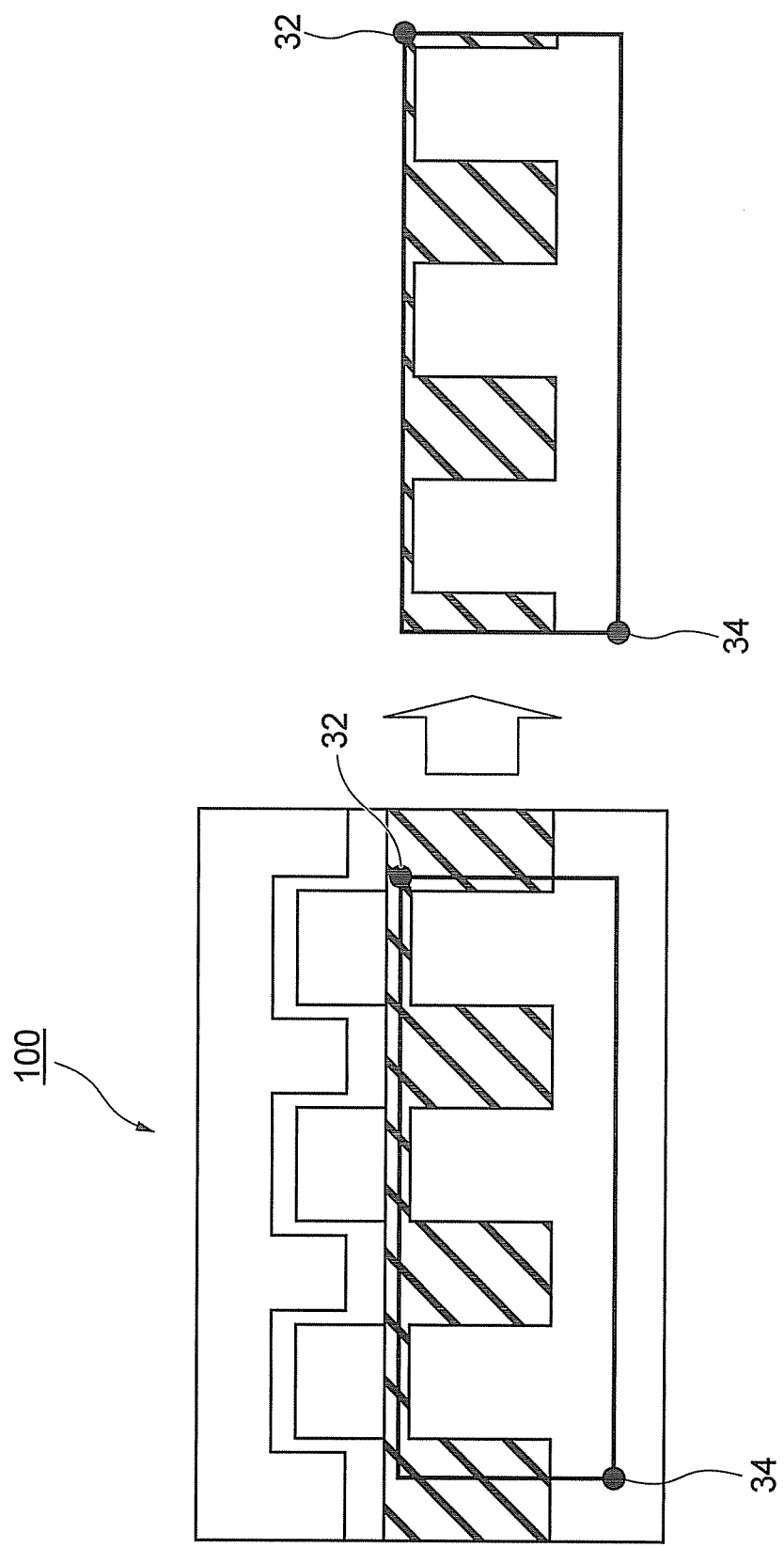
FIG. 5 is an explanatory diagram of a first comparative example.

In the case of a three-dimensional process simulator, if, for example, coordinates of two points 32 and 34 in a structure 100 shown in FIG. 5 are input to the computer 10, a rectangular parallelepiped having a segment that connects the two points 32 and 34 as a diagonal is set as a calculation region. In the three-dimensional calculation, inputting and designating two coordinate values alone is easy. However, in the case of a calculation for a complex semiconductor element, the region to be restricted is complex, and the number of coordinate points to input is increased, and moreover, coordinate points to input may be erroneously entered. Thus, an increased burden on the TCAD user is a problem in Comparative Example 1.

Comparative Example 2

Comparative Example 2 concerns a method of specifying a region in accordance with the second method described above and calculating impurity diffusion. According to this method, when a calculation region for diffusion of impurities is specified, the material of an element is designated, and the diffusion of impurities in this material is thereby calculated. For example, in the target structure 100 shown in FIG. 6, the impurity diffusion of a silicon portion 20 of a semiconductor element alone is to be calculated. In this case, the user inputs a command to the computer 10 to specify the silicon portion 20, so that the computer 10 performs an impurity diffusion calculation for the silicon portion 20 alone and returns the result of this calculation to the original simulation structure to execute the subsequent simulation.

In Comparative Example 2, the TCAD user only inputs a command to designate a material and thereby specify a region subject to an impurity diffusion calculation, so that the amount of input data can be reduced, as compared with Comparative Example 1.

Figure 6:
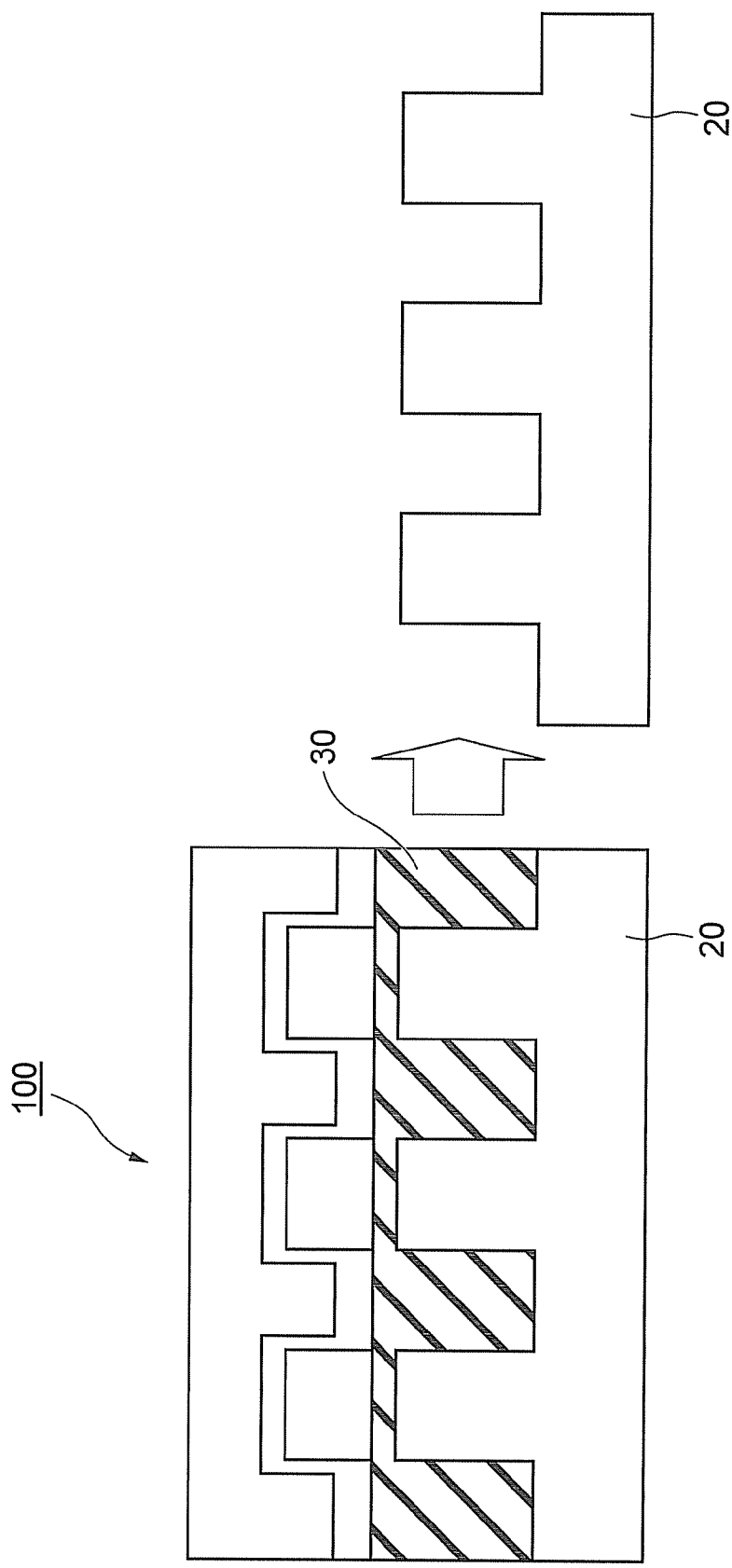
FIG. 6 is an explanatory diagram of a second comparative example.
Figure 7:
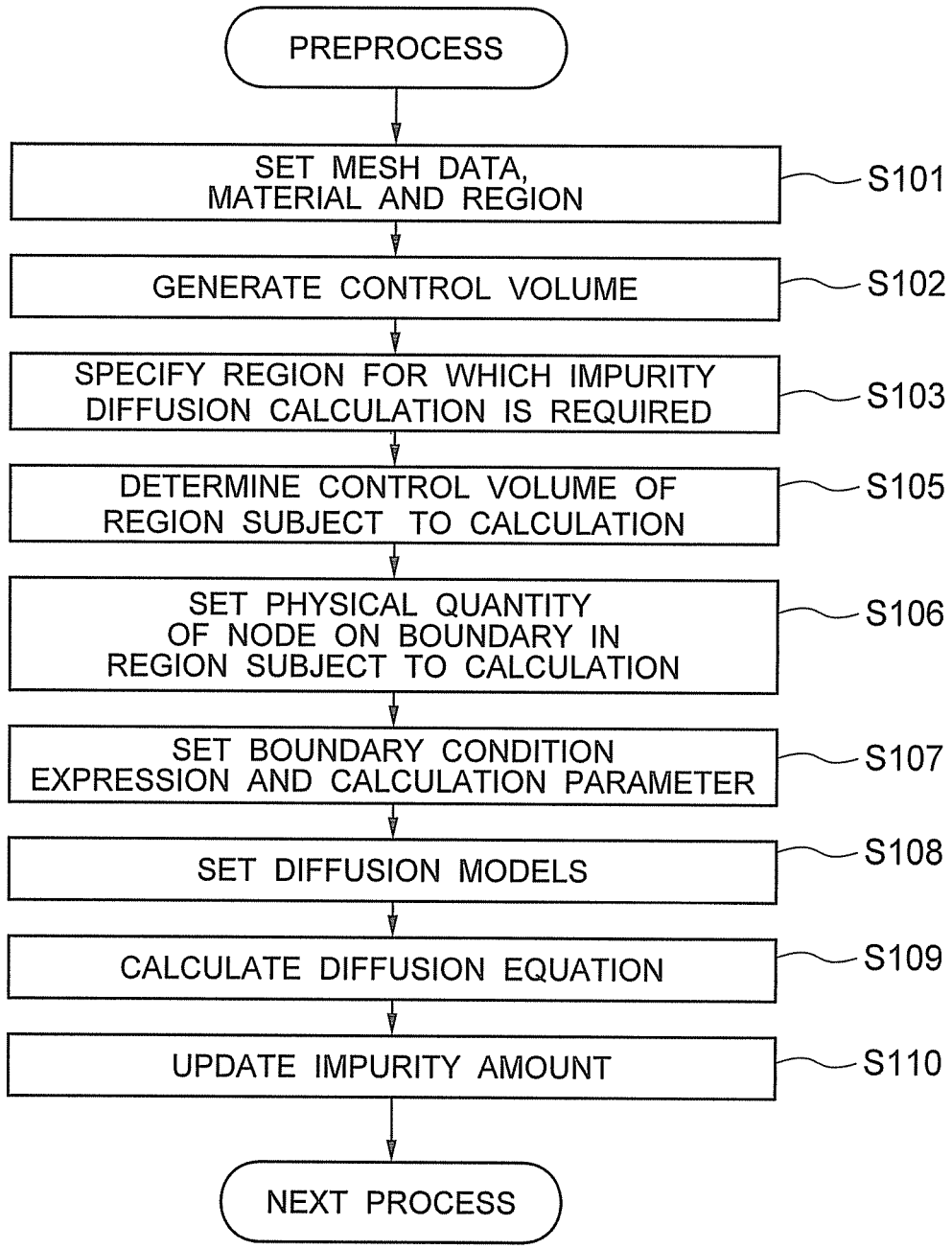
FIG. 7 is a flowchart showing a schematic procedure according to the second comparative example.

However, according to Comparative Example 2, information on the material of a component which has been in contact with the calculation target region in the original structure but which is excluded as a result of the specification of the calculation region is not considered, as shown in step S106 in the flowchart of FIG. 7 that shows a schematic procedure according to Comparative Example 2. Thus, when boundary conditions are set in step S107, information on an interface with the component which has been originally in contact, for example, a silicon oxide film 30 in the example of FIG. 6 is not considered, and a calculation is performed under a reflective boundary condition, so that the calculation accuracy is reduced. That is, the boundary condition expression which can be properly set if a calculation is performed without specifying any region cannot be set according to Comparative Example 2. Thus, the problem of Comparative Example 2 is the low accuracy of impurity profiles of materials that are different in the original simulation structure.

According to the process simulation of the embodiment, a virtual film made of the same material as the material of the adjacent component is set in such a manner as to be added to the interface of the specified region, in contrast with Comparative Example 2. Thus, the boundary conditions for the segregation or dose loss at the interface can be easily added to the diffusion equations with fewer burdens on the user. Consequently, calculation time can be reduced, and a highly accurate inspection can be conducted.

Figure 8:
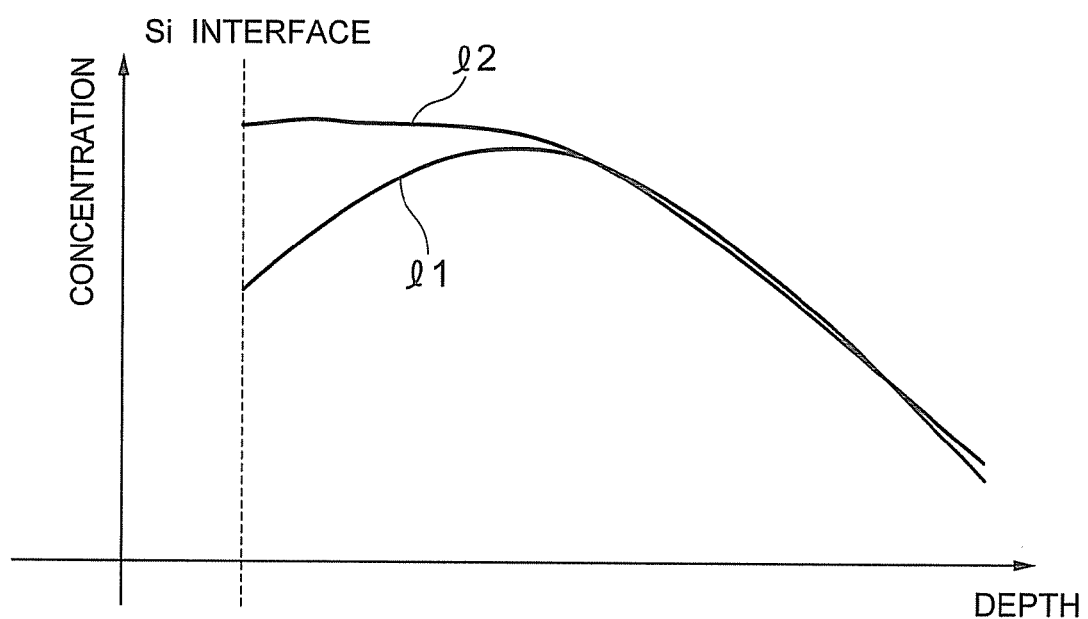
FIG. 8 is an explanatory diagram showing the difference between the embodiment shown in FIG. 2 and the second comparative example.

The difference between the embodiment and Comparative Example 2 is described with reference to a graph in FIG. 8. In FIG. 8, a curve I2 represents a concentration profile when a calculation is performed for the silicon portion 20 alone without considering the silicon oxide film 30 at all. A curve I1 represents a concentration profile when a calculation is performed together with the virtual film to which the same material data as the silicon oxide film 30 is provided according to the embodiment. It is found out from FIG. 8 that the difference of the impurity concentrations is obvious in the vicinity of the interface between the silicon portion 20 and the silicon oxide film 30. According to the embodiment, a calculation is performed for the silicon portion 20 together with the virtual film. Therefore, the segregation and dose loss at the interface are considered, and the boundary condition of the calculation region is properly set. It is thus apparent that, in contrast with Comparative Example 2, the calculation accuracy is not decreased.

Figure 9A:
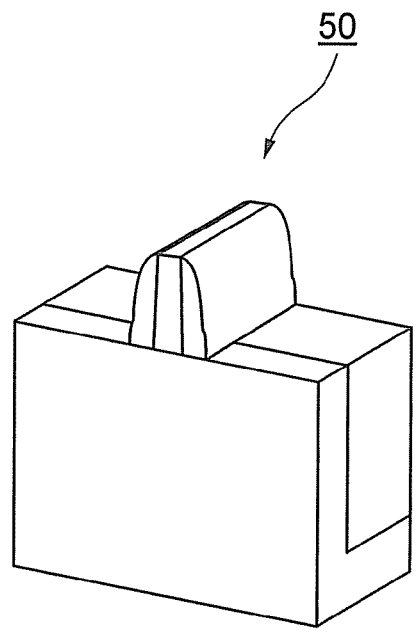
FIG. 9A is a diagram showing an example of a structure targeted for the process simulation.
Figure 9B:
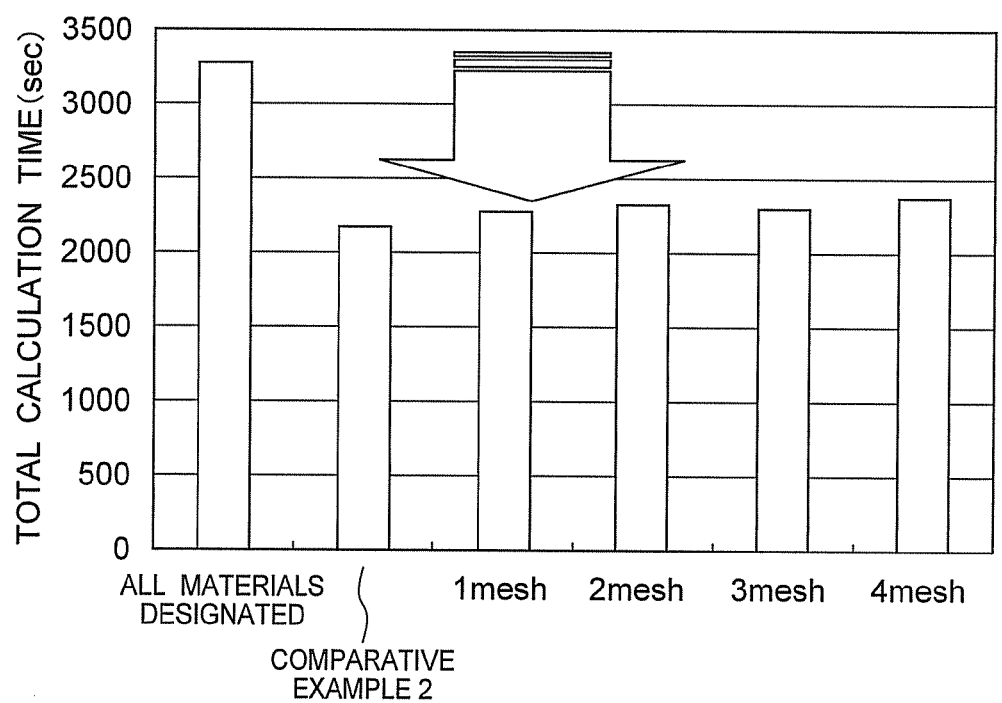
FIG. 9B is a diagram showing an example of effects of the simulation shown in FIG. 2.

The effects of the process simulation according to the embodiment are more specifically described with reference to FIGS. 9A to 10. For example, as shown in FIG. 9A, in creating a metal oxide semiconductor field effect transistor (MOSFET) 50 having a shallow trench isolation (STI) of a gate length Lg=45 nm, the impurity diffusion calculation accounts for about 90% of the total calculation time of the process simulation. As shown in FIG. 9B, according to the embodiment, even when the number of mesh elements is one, the calculation time can be reduced by about 30% substantially equally to Comparative Example 2 as compared with the case where all the materials are designated to perform a calculation. Moreover, it is apparent that even if the number of mesh elements is four and the thickness of the virtual film is increased to some degree, the calculation time remains substantially unchanged compared with that in Comparative Example 2.

Figure 10:
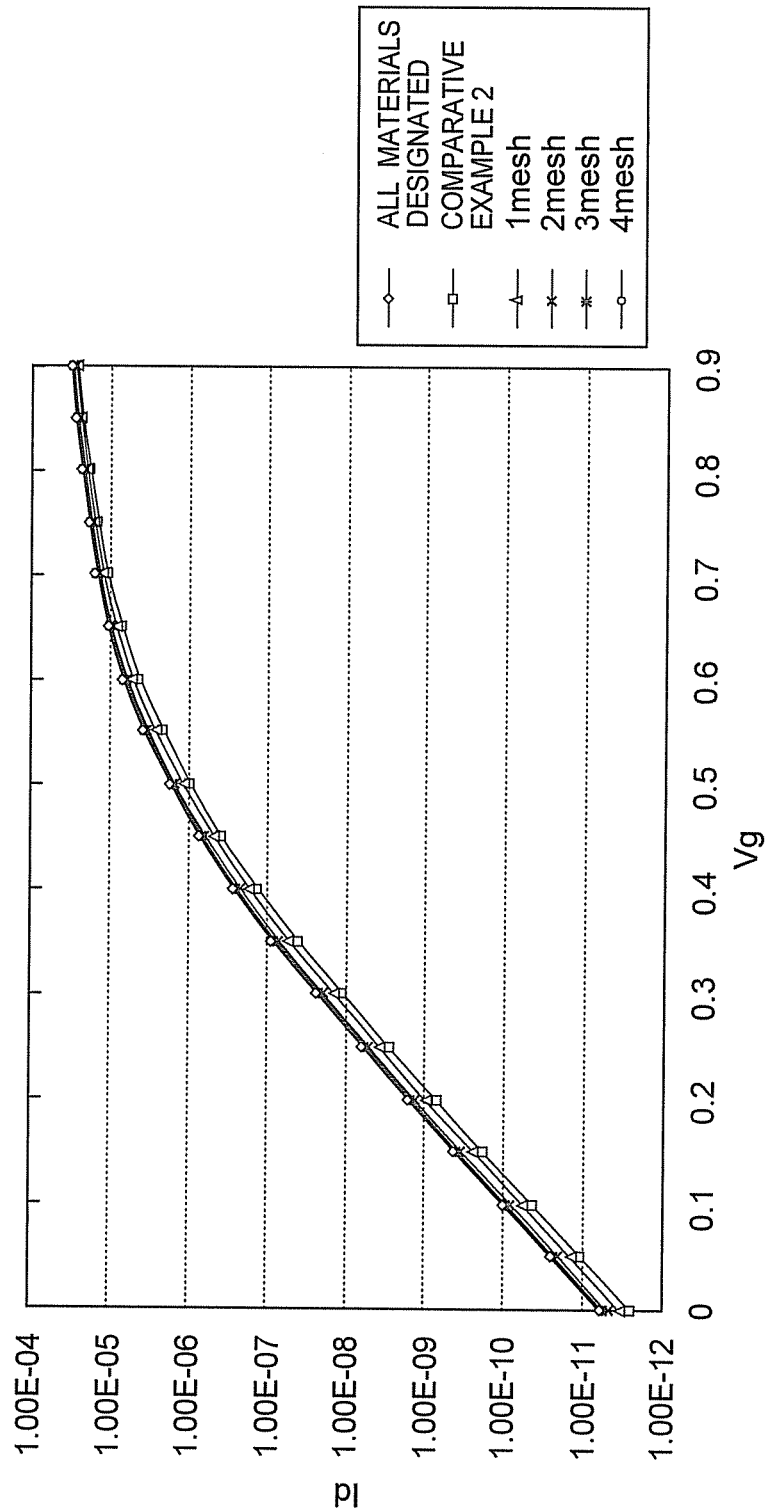
FIG. 10 is a diagram showing an example of effects of the simulation shown in FIG. 2.

FIG. 10 shows the results of device simulations regarding IV characteristics of the MOSFET 50 having the STI that are created for six cases in FIG. 9B. As shown in FIG. 10, it is apparent that sufficient accuracy is not obtained by the process simulation according to Comparative Example 2. In contrast, it is apparent that the calculation accuracy is improved according to the process simulation of the embodiment. In particular, if the thickness of the virtual film is set to be equal to or more than three mesh elements or more, the accuracy is about the same as that when all the materials are designated, and the calculation accuracy is considerably improved.

Operation characteristics are verified by a device simulation in response to a highly accurate process simulation result according to the embodiment, and if the result of the verification is reflected in device design, semiconductor devices having satisfactory operating characteristics can be manufactured with a high throughput.

While certain embodiments have been described, these embodiments have been presented by way of example only, and are not intended to limit the scope of the inventions. Indeed, the novel methods and systems described herein may be embodied in a variety of other forms; For example, although the three-dimensional process simulation has been mainly described by way of example in the embodiment, it should be understood that the present invention is not limited to the three-dimensional process simulation and is also applicable to one-dimensional and two-dimensional process simulations. Moreover, silicon dioxide ($SiO_2$) and silicon nitride ($Si_3N_4$) have been described in the embodiment by way of example as the materials of the second component in contact with the first component. However, it should be understood that the present invention is not limited to such materials and a virtual film made of a material such as a metal can be used depending on the structure of a calculation target.

Furthermore, various omissions, substitutions and changes in the form of the methods and systems described herein may be made without departing from the spirit of the inventions. The accompanying claims and their equivalents are intended to cover such forms or modifications as would fall within the scope and sprit of the invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of simulating a manufacturing process of a structure which comprises a plurality of adjacent components, the method comprising causing a computer to perform operations of:

importing mesh data and material data which are set for each of components;

specifying, as a calculation target region, a region in a first component in which impurities are to be diffused among the components, the specified calculation target region being a part of the structure;

setting, other than the components of the structure, a virtual film of a desired thickness in contact with the specified calculation target region, the material of the virtual film being the same as the material of a second component in contact with the specified calculation target region;

setting boundary conditions at interface between the specified calculation target region and the virtual film on the basis of the material data;

incorporating the boundary conditions into a diffusion equations to solve the diffusion equations of the specified calculation target region and the virtual film; and bringing data on the concentration of impurities of the specified calculation target region obtained by the calculation into data on the structure before the specification of the calculation target region.

2. The method of claim 1, further comprising:

bringing data on the concentration of impurities of the virtual film obtained by the calculation into data on the second component.

3. The method of claim 1, wherein the calculation target region is specified by designating a material.

4. The method of claim 1, wherein the second component is formed by a plurality of layers or films, and wherein the boundary conditions are set for each of the layers or films.

5. The method of claim 1, wherein setting the boundary conditions comprises setting physical quantities of a node between the specified calculation target region and the virtual film.

6. The method of claim 1, wherein the material of the second component comprises at least one of an insulating film and a metal.

7. The method of claim 1, wherein the virtual film is constituted by a control volume generated on the basis of three or more mesh elements adjacent to an interface with the specified calculation target region among mesh elements of the second component.

8. A non-transitory computer-readable recording medium containing a program to cause a computer to execute a process simulation of a structure which comprises a plurality of adjacent components, said process simulation comprising:

importing mesh data and material data which are set for each of components;

specifying, as a calculation target region, a region in a first component in which an impurity is to be diffused among the components, the specified calculation target region being a part of the structure;

setting, other than the components of the structure, a virtual film of a desired thickness in contact with the specified calculation target region, the material of the virtual film being the same as the material of a second component in contact with the specified calculation target region;

setting boundary conditions at interface between the specified calculation target region and the virtual film on the basis of the material data;

incorporating the boundary conditions into diffusion equations to solve the diffusion equations of the specified calculation target region and the virtual film; and bringing data on an impurity concentration of the specified calculation target region obtained by the calculation into data on the structure before the specification of the calculation target region.

9. The medium according to claim 8, wherein said process simulation further comprises bringing data on the concentration of impurities of the virtual film obtained by the calculation into data on the second component.

10. The medium according to claim 8, wherein the calculation target region is specified by designating a material.

11. The medium according to claim 8, wherein the second component is formed by a plurality of layers or films, and wherein the boundary conditions are set for each of the layers or films.

12. The medium according to claim 8, wherein setting the boundary conditions comprises setting physical quantities of a node between the specified calculation target region and the virtual film.

13. The medium according to claim 8, wherein the material of the second component comprises at least one of an insulating film and a metal.

14. The medium according to claim 8, wherein the virtual film is constituted by a control volume generated on the basis of three or more mesh elements adjacent to an interface with the specified calculation target region among mesh elements of the second component.

* * * * *